United States Patent [19]

Taguchi et al.

[11] Patent Number: 4,464,420

[45] Date of Patent: Aug. 7, 1984

[54] CERAMIC MULTILAYER CIRCUIT BOARD AND A PROCESS FOR MANUFACTURING THE SAME

[75] Inventors: Noriyuki Taguchi; Tsuyoshi Fuzita, both of Yokohama; Gyozo Toda, Hino; Syoosaku Ishihara, Yokohama; Takashi Kuroki, Yokohama; Tatsuhiro Suzuki, Yokohama, all of Japan

[73] Assignee: Hitachi, Ltd., Tokyo, Japan

[21] Appl. No.: 421,833

[22] Filed: Sep. 23, 1982

[30] Foreign Application Priority Data

Sep. 24, 1981 [JP] Japan .................................. 56-149484

[51] Int. Cl.³ .............................................. B05D 5/12
[52] U.S. Cl. ....................................... 427/96; 427/101; 427/103
[58] Field of Search .......................... 427/96, 101, 103

[56] References Cited

U.S. PATENT DOCUMENTS 3,381,256 2/1966 Schuller .............................. 427/103
4,316,920 2/1982 Brown ................................ 427/101

Primary Examiner—Norman Morgenstern
Assistant Examiner—James J. Seidleck
Attorney, Agent, or Firm—Antonelli, Terry & Wands

[57] ABSTRACT

A ceramic multilayer circuit board is provided by sintering a multilayer wiring substrate containing alumina as a main component, which was prepared by the green sheet process, nickel plating and gold plating in this order on the superficial wiring conductor layer, printing a thick film conductor paste on the gold plating layer, firing the printed substrate and finally printing a thick film resistor paste on at least part of the thick film conductor layer and firing to form a thick film resistor layer.

9 Claims, 7 Drawing Figures

CERAMIC MULTILAYER CIRCUIT BOARD AND A PROCESS FOR MANUFACTURING THE SAME

BACKGROUND OF THE INVENTION

This invention relates to a ceramic multilayer circuit board and a process for manufacturing said board.

Recently, electronic circuit products have highly frequently been given high performance, miniaturized and made cheaper by using a ceramic circuit board. Processes for manufacturing the ceramic boards can be roughly classified into two types. One of the types is a green sheet process and the other is a thick film process. In the former process, a high melting conductor paste containing a metal, such as tungsten, molybdenum or molybdenum-manganese, is printed through a screen mask onto an as-formed alumina green sheet to form a circuit pattern and then the printed sheet is sintered at about 1600° C. in a reducing atmosphere. In the latter process, the conductor paste is printed onto a sintered alumina substrate, which is then fired, and a resistor paste is printed onto the substrate, which is then fired. The conductor paste comprises a mixture of a conductive powder, such as a powder of silver, platinum, palladium or gold and a binder glass powder, which mixture is intimately kneaded with an organic vehicle. The resistor paste has approximately the same composition as that of the conductor paste, except that silver, palladium and ruthenium oxide are used as a conductive material. A high range resistance of a desired level can be obtained by controlling a ratio of the conductive material and the glass binder.

The green sheet process can easily produce a fine wiring (e.g. about 100 microns) printed and multilayered board, and thus it is suitable for obtaining a high density circuit board but it is not suitable for obtaining a needed resistance, because a resistor paste using a high melting metal cannot provide a high range resistance when sintered at a high temperature, e.g. 1600° C., and such a resistance cannot be controlled even by trimming because of the hardness of the resulting resistor. On the other hand, the thick film process can easily produce a resistor because a resistor paste is fired at a temperature below 1000° C. In other words, the thick film process can easily provide a precise resistance of a desired level by using various paste compositions or properly trimming. However, the thick film process is poorer in obtaining a high density wiring or stacking more layers than the green sheet process.

Combining the characteristics of the green sheet process with those of the thick film process has been considered in which a thick film resistor is formed by the thick film process on a ceramic substrate formed by the green sheet process and sintered, to make a high density circuit board.

Japanese Patent Laid-Open No. 14975/74 discloses a process for manufacturing an integrated circuit board comprising the steps of providing a ceramic green sheet having a heat resistant conductive layer applied thereon in such a manner that part of the layer to which an element is connected is exposed, sintering said green sheet in a reducing atmosphere, forming an oxidation resistant conductor as a protective layer on the exposed part either by plating or the thick film process and then connecting the element to said part by heat treating in an oxidizing atmosphere.

However, there is a critical problem in making a ceramic multilayer circuit board by the prior process that when a thick film resistor paste is fired in air a wiring conductor on a ceramic substrate is undesirably oxidized. As a wiring conductor metal to be applied on the ceramic substrate there is used a metal of so high a melting point that it is not molten at a temperature of sintering the ceramic substrate, such as tungsten, molybdenum or molybdenum-manganese. However, these metals are easily oxidized under conditions for firing a thick film resistor paste (temperature: 500° to 1000° C., term: 10 minutes and atmosphere: air). In order to prevent the wiring conductor from oxidization, a way of firing the thick film conductor and resistor in a neutral atmosphere such as nitrogen gas or a way of plating the conductor with a non-oxidizable metal are considered. In the former way, a conductor paste which is firable in a nitrogen atmosphere is already commercially available and obtains good results but, on the other hand, no good resistor paste which is firable in a nitrogen atmosphere and practicable has yet been developed. Thus, the former way is not yet practicable.

Therefore, such a process as shown in FIG. 1 has been adopted. In FIG. 1, a conductor wiring is formed by printing on an alumina green sheet, the multilayering is carried out and then the multilayered alumina green sheet is sintered, which is not different from the prior art. The feature of the process as shown in FIG. 1 is that a wiring conductor such as tungsten is plated with nickel after sintering the alumina green sheet, the nickel plating layer is plated with gold in order to prevent the nickel surface from being oxidized, and finally a thick film resistor paste is printed on the gold plating layer and fired. A cross-sectional view of the resutling multilayer circuit board is diagrammatically shown in FIG. 2. In FIG. 2, reference numbers 1, 2, 3, 4, 4A, 5, 5A and 6 represent an alumina insulative substrate, wiring conductor, multilayered wiring substrate, nickel plating layer (electrode for thick film resistor), nickel plating layer (soldering part), gold plating layer (electrode for thick film resistor), gold plating layer (soldering part), and thick film resistor, respectively.

In the structure as shown in FIG. 2, nickel plating layers 4 and 4A directly under thick film resistors 6 are reacted with gold plating layers 5 and 5A, so that nickel is diffused to reach the top surface of the gold plating layers. Therefore, the nickel diffused is contacted and reacted with the conductive components or glass components present in the thick film resistor paste to form a reaction product at the thick film resistor terminal. Thus, in the prior art, no stable resistance can be obtained. Furthermore, the prior art requires a gold plating layer of more than 4 microns in thickness in order to obtain a stable resistance and to prevent the nickel surface from being oxidized. Therefore, the ceramic multilayer circuit board thus produced has a drawback that the cost for manufacturing it is expensive.

SUMMARY OF THE INVENTION

An object of this invention is to provide a process for manufacturing a ceramic multilayer circuit board having no drawback as in the prior art, in which process a conductor applied on a ceramic green sheet is prevented from being oxidized.

Another object of this invention is to provide an inexpensive ceramic multilayer circuit board having a thick film resistor formed on a substrate prepared by the green sheet process.

DETAILED DESCRIPTION OF PREFERRED EMBODIMENTS

In accordance with this invention, a conductor wiring of a high melting metal such as tungsten is deposited onto an alumina green sheet, the green sheet is multilayered and sintered, the wiring conductor is plated with nickel, the nickel plating layer is further plated with gold for the purpose of preventing the nickel plating layer from being oxidized, a thick film conductor paste is printed onto the gold plating layer and fired to form a thick film electrode, and finally a thick film resistor paste is printed onto the electrode to produce a ceramic multilayer circuit board. In accordance with the procedure mentioned above, the thick film resistor is not formed directly on the gold plating layer but on the thick film conductor in the same fashion as in the thick film process. Therefore, the resulting resistance is extremely stable. The nickel diffused at the surface of the plating layer when the thick film conductor paste is fired, is directly contacted with the thick film conductor, but this contact has no adverse effect on the thick film resistor. Therefore, the gold plating layer in this invention may be thinner than that in the prior art process. This means that gold is used in a less amount and the cost is reduced.

An alternative process for manufacturing the ceramic multilayer circuit board is a laminating process. In the laminating process, a required number of ceramic green sheets having through-holes beforehand filled with a conductor paste is provided, a desired conductor wiring pattern is screen printed onto each of the green sheets, and these screen printed green sheets are laminated by a press and finally sintered to manufacture the ceramic multilayer circuit board.

Figure 7:
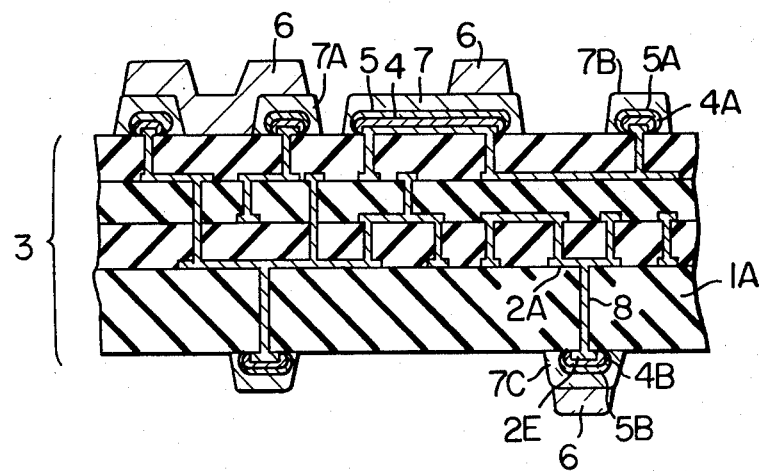
FIG. 7 is a diagrammatical cross-sectional view of the structure of a ceramic multilayer circuit board in accordance with another embodiment of this invention.

In any process of printing or laminating, a base or initial green sheet also may be beforehand perforated to make through-holes, which are then filled with a conductor paste to form a ceramic multilayer circuit board having a thick film conductor and thick film resistor on both the sides thereof, a thick film conductor and thick film resistor on both the sides thereof, as shown in FIG. 7. That is, in FIG. 7, through-holes 8 are provided in insulative layer 1A at predetermined sites thereof, conductor pattern 2E is provided on the bottom surface of insulative layer 1A, and electrical connection is made between the conductor patterns on both the sides of insulative layer 1A. Subsequently, said conductor pattern 2E is provided thereon with nickel plating layer (opposite electrode for thick film resistor) 4B, gold plating layer (opposite electrode for thick film resistor) 5B, opposite thick film conductor 7C and opposite thick film resistor 6. The ceramic multilayer circuit board thus obtained can be provided on both the sides thereof with individual parts or elements and, hence, said board can be further miniaturized and more freely designed.

In this invention, a capacitor may be provided by printing a conductor paste in greater areas of electrodes in the circuit as desired.

This invention will be more detailedly illustrated below with reference to the drawings.

Figure 4:
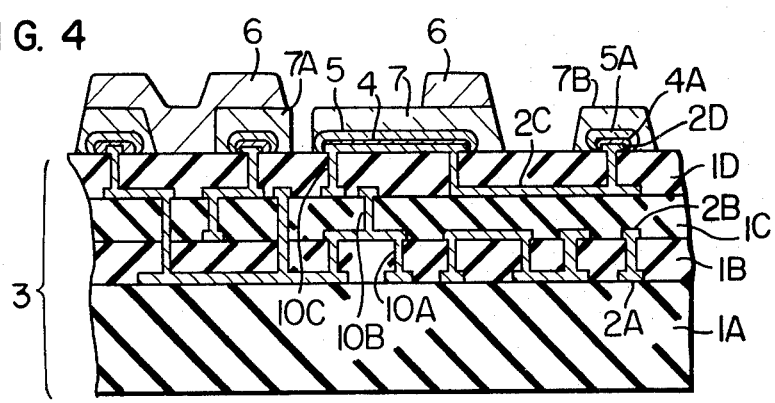
FIG. 4 is a diagrammatical cross-sectional view of the structure of a ceramic multilayer circuit board in accordance with one embodiment of this invention.

In FIG. 4, a ceramic multilayer circuit board comprises multilayered wired substrate 3 consisting of alumina insulative layers 1 (layers 1A, 1B, 1C and 1D from the bottom) and wiring conductor layers 2 (layers 2A, 2B, 2C and 2D), nickel plating layers (electrodes for thick film resistor 4 and soldering parts 4A), gold plating layers (electrodes for thick film resistor 5 and soldering parts 5A), thick film resistors 6, and thick film conductors (electrodes for thick film resistor 7 and 7A, and soldering parts 7B), said alumina insulative layers 1 having through-holes 10 (10A, 10B and 10C from the bottom) filled with conductors connecting said wiring conductors 2.

EXAMPLES 1 to 3

The ceramic multilayer circuit board as shown in FIG. 4 was prepared by the following procedure. Firstly, a commercial tungsten-containing paste was printed through a screen mask onto a green sheet (surface area: 50×50 mm and thickness: 0.8 mm) to form wiring conductor layer 2A. The green sheet used was prepared by slip casting with a doctor blade by using a mixture of 100 grs. of an aluminous ceramic powder (92.4 wt. % $Al_2O_3$, 1.9 wt. % MgO and 5.7 wt. % $SiO_2$) and 60 grs. of polyvinyl butyral as a binder and trichloroethylene as a solvent. For multilayering, an alumina insulative paste was printed through a screen mask onto the wired green sheet prepared above, so as to form first insulative layer 1B having through-holes 10A at desired sites thereof. The alumina insulative paste used was made from the same ceramic composition as that of said green sheet, except that the solvent used was n-butyl carbitol acetate. Then a tungsten-containing paste was printed on the first insulative layer to form a second wiring conductor layer 2B. The wiring conductor layer 2B connected to the first wiring conductor layer 2A at desired sites of the wiring conductors 2A through the through-holes 10A of the first insulative layer. Subsequently, the insulator paste and the conductor paste were alternately printed in the same manner as above, and thus a multilayer green substrate having four conductor layers 2A, 2B, 2C and 2D which were contacted through through-holes 10B and 10C with one another.

The multilayer green sheet having the wiring conductor layers applied therein was sintered at 1600° C. for 1 hour in an atmosphere of a mixed gas comprising nitrogen, hydrogen and water vapor to obtain a multilayered wired substrate. Nickel plating layers 4 and 4A of 3 microns in thickness were formed by using a commercial nickel chemical plating bath on the tungsten conductor layer of the sintered multilayer substrate.

Prior to the nickel plating, the sintered tungsten conductor layer was activated at the surface thereof by dipping said substrate in a caustic soda solution at 80° C. for 10 minutes to wash said surface and placing said substrate in a palladium chloride-caustic soda solution at 80° C. for 1 minute to substitute palladium for the surface of tungsten. After the nickel plating was completed, gold plating layers 5 and 5A were formed on the nickel plating layers by using a commercial gold chemical plating bath. The thickness of the gold plating layer was changed within a range of 0.1 to 4 microns by changing the plating time. After the gold plating was completed, a thick film conductor paste was printed on the gold plating layers through a screen mask to form thick film conductor layers 7, 7A and 7B. The thick film conductor pastes used were three commercial pastes (A, B and C) which are different in their firing temperature from one another. The firing temperature range, conductor components, kind of binder glass and softening point of the binder glass of the thick film conductor pastes are reported in Table 1. These pastes all are firable in air.

TABLE 1

| Ex. No. | Conductor Paste | Firing Temp. Range | Conductor Components | Binder Glass | Softening Point of Binder Glass |
|---|---|---|---|---|---|
| 1 | A | 500–600° C. | Ag - Pt | lead borosilicate bismuth oxide | 480–520° C. |
| 2 | B | 600–700° C. | Ag - Pd | lead borosilicate bismuth oxide | 520–560° C. |
| 3 | C | 750–950° C. | Ag - Pd | lead borosilicate bismuth oxide | 560–600° C. |

After the thick film conductor paste was fired, a thick film resistor paste was printed through a screen mask on the thick film conductor layer 7 and then fired in air to form a thick film resistor layer.

In these examples three commercial ruthenium-containing pastes (AR, BR and CR) were used as the thick film resistor paste. These pastes are different in their firing temperature from one another. The conductor component and binder glass of these resistor pastes were ruthenium oxide and lead borosilicate, respectively, and the firing temperature range and the softening point of these resistor pastes were all the same as those of the thick film conductor pastes.

In FIG. 4, nickel plating layers 4 and 4A are electrically connected through the third conductor layer 2C to each other. Therefore, the comparison of resistance $R_1$ between thick film conductor layers 7 and 7B with resistance $R_0$ between nickel plating layers 4 and 4A which have not yet been covered by the thick film resistor paste and fired makes it possible to check on whether or not the tungsten conductor layer (surface area of the through-holes: 0.1 mm$^2$) on the multilayer substrate and the nickel plating layers were oxidized when the thick film conductor or resistor layer was fired.

Figure 5:
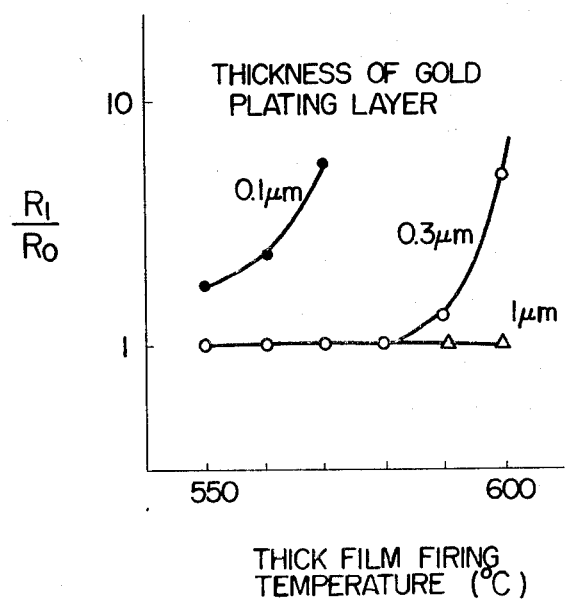
FIG. 5 is a graph showing a relationship between a temperature of firing a thick film resistor and conductor and a ratio, $R_1/R_0$, of resistances of tungsten wirings in both the sides of the firing step when the thickness of a gold plating layer is changed as a parameter.
Figure 6:
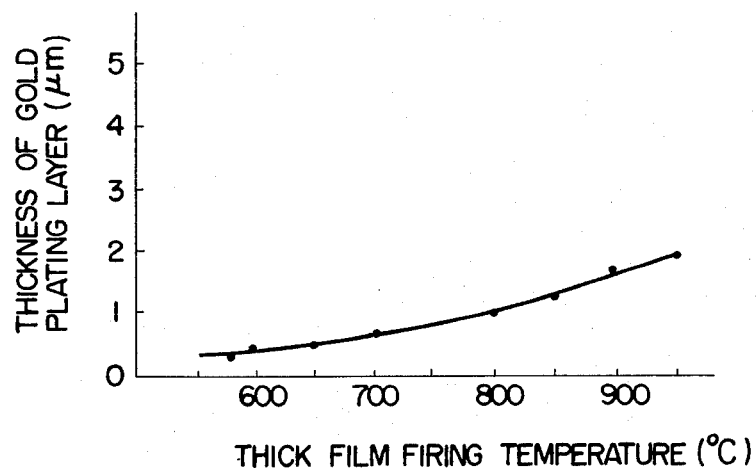
FIG. 6 is a graph showing a relationship between the thickness of a gold plating layer required to prevent both tungsten and nickel from being oxidized and the temperature of firing a thick film resistor and conductor.

FIG. 5 is a graph showing the relationship between the temperature of firing thick film conductor plaste A and thick film resistor paste AR and the ratio, $R_1/R_0$ of the resistances of tungsten before and after firing, in terms of a gold plating thickness parameter. From this graph it is found that the ratio, $R_1/R_0$ varies greatly depending upon the gold plating thickness and the thick film firing temperature. That is, the thicker the gold plating layer, the smaller the ratio becomes and the lower the thick film firing temperature, the smaller the ratio becomes. For example, when the thickness of gold plating layer is 0.1 micron, tungsten and nickel are oxidized at a thick film firing temperature of higher than 550° C., but they both are not oxidized even at a thick film firing temperature of 580° C. when the thickness of gold plating layer is 0.3 micron. The same procedure as mentioned above was carried out for the other thick film conductor pastes (B and C) and thick film resistor pastes (BR and CR). Thus, the thickness of gold plating layer required to prevent tungsten and nickel from being oxidized was called for in relation to various thick film firing temperatures. This relationship is shown in FIG. 6. The abscissa represents the thick film firing temperature (° C.) and the ordinate the thickness of gold plating layer (micron). From FIG. 6 it is found that in this invention the thickness of gold plating layer required to prevent tungsten and nickel from being oxidized is at most 2 microns even when the thick film firing temperature is 950° C. in air, which is one-half or smaller than the prior thickness of gold plating layer.

Furthermore, when the thick film firing temperature is lower, the thickness of gold plating layer is smaller than 2 microns. The thicknesses of gold plating layer when fired at 800° C., 700° C. and 600° C. were 1, 0.6 and 0.4 micron, respectively. Thus, it is found that this invention is satisfied with highly thin gold plating layer.

EXAMPLE 4

Four alumina green sheets of 0.3 mm in thickness were provided, each of the green sheets was perforated by punching, the resulting through-holes were filled with a conductor paste, a wiring conductor paste was printed on each of the green sheets, these green sheets were stacked and pressed (pressure : 10 kgs./cm$^2$; temperature: 120° C.; and term: 10 minutes), and the stacked green sheets were sintered to form a multilayer substrate. Subsequently, a thick film conductor paste and a thick film resistor paste were screen printed on the multilayer substrate and sintered in the same manner as in Examples 1 to 3 to obtain a ceramic multilayer circuit board. The same results as those of Examples 1 to 3 were obtained.

EXAMPLE 5

Figure 1:
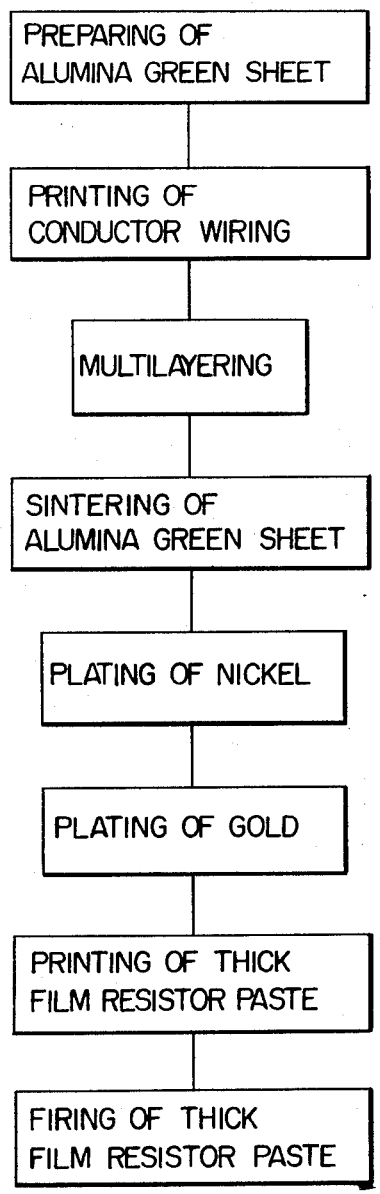
FIG. 1 is a flow sheet of a prior art process for manufacturing a ceramic multilayer circuit board.
Figure 3:
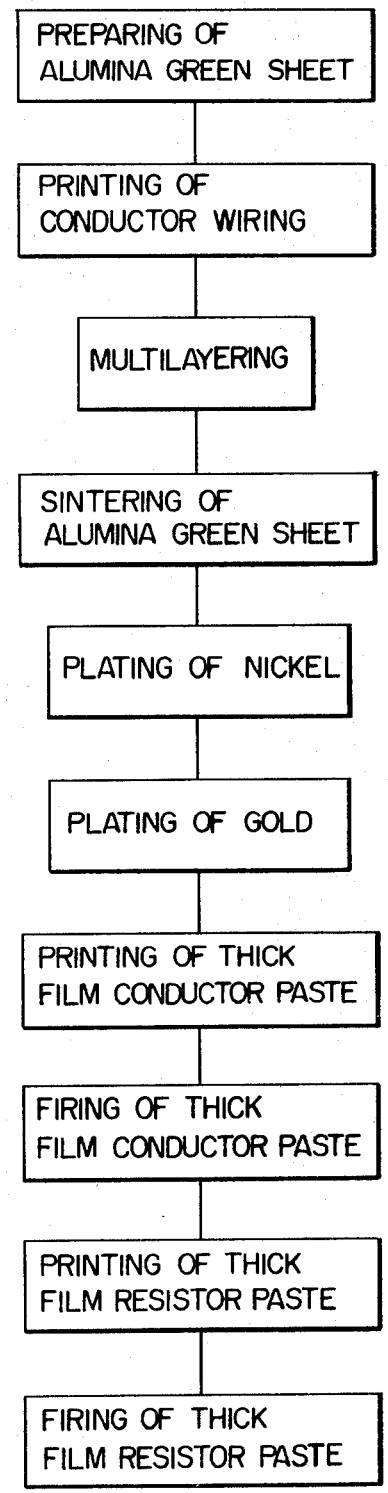
FIG. 3 is a flow sheet in accordance with one embodiment of this invention.
Figure 2:
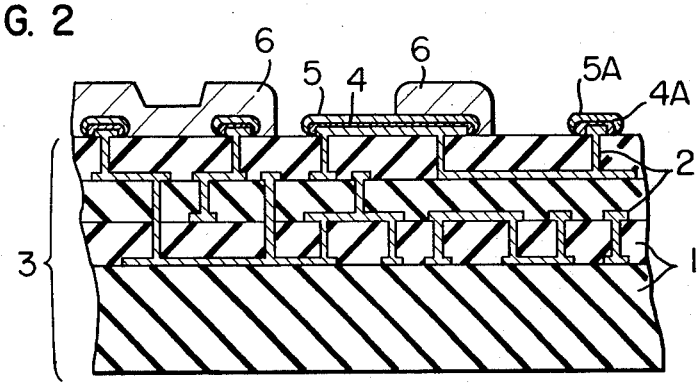
FIG. 2 is a diagrammatical cross-sectional view of the structure of a prior art ceramic multilayer circuit board.

A ceramic multilayer circuit board was prepared in accordance with the procedure as shown in FIG. 3. A molybdenum containing paste was used which was provided by mixing 10 grs. of molybdenum powder having 80 wt. % of 2 micron particles and 20 wt. % of 0.5 micron particles with 2.5 cc. of an organic vehicle. The sintering temperature of the green sheet on which the molybdenum containing paste was applied was 1570° C. The other conditions for preparing the ceramic multilayer circuit board were the same as those in Examples 1 to 3. The same results as those of Examples 1 to 3 were obtained.

As is clear from the preceding examples, the process of this invention makes it possible to form a thick film resistor layer having a highly precise resistance in an extremely stable manner on a ceramic multilayer substrate having a very fine and high density wiring. Therefore, the surface area of substrate can be one-third of that of the prior art or smaller. Furthermore, an yield is improved, and the amount of gold to be plated is more than two times less than that of the prior art. Therefore, in accordance with this invention the ceramic multilayer circuit board can be made at a low cost.

What is claimed is:

1. A process for manufacturing a ceramic multilayer circuit board which comprises the steps of providing a ceramic multilayer wiring substrate by the green sheet process, sintering said substrate, nickel plating and gold plating in this order on a tungsten, molybdenum or molybdenum-manganese superficial wiring conductor layer on at least one of the top and bottom insulative layers, printing an Ag-Pt or Ag-Pd-containing thick film conductor paste on the gold plating layer, firing the printed substrate and finally printing a thick film resistor paste on at least part of the thick film conductor layer and firing to form a thick film resistor layer.

2. The process according to claim 1, wherein a green sheet containing alumina as a main component is provided in the green sheet process, a conductor paste containing tungsten, molybdenum or molybdenum-manganese powders is screen printed on the green sheet to form a wiring pattern, an insulative paste containing the same composition as that of the green sheet is printed on the wiring pattern, the conductor paste is printed on the insulative layer, these printing steps are alternatively repeated to form the multilayer wiring substrate having a desired number of layers, each green sheet layer having through-holes and one wiring pattern being electrically connected to another wiring pattern through the through-holes filled with the conductor paste.

3. The process according to claim 1, wherein green sheets containing alumina as a main component are provided, a conductor paste containing tungsten, molybdenum, or molybdenum-maganese powders is screen printed on each of the green sheets to form a wiring pattern, thus providing a desired number of the wiring pattern printed green sheets, and these green sheets are stacked to form a multilayer wiring substrate, each sheet having through-holes and the wiring pattern on one sheet being electrically connected to that on another sheet through the through-holes filled with the conduct paste.

4. The process according to claim 1, 2 or 3, wherein the multilayer wiring substrate is sintered at a high temperature of about 1600° C. in a reducing atmosphere.

5. The process according to claim 1, 2 or 3, wherein the thick film conductor paste is fired at a temperature of 550° to 950° C. in air.

6. The process according to claim 1, 2 or 3, wherein the thick film resistor paste is fired at a temperature of 550° to 950° C. in air.

7. The process according to claim 1, 2 or 3, wherein the conductor paste also contains a lead borosilicate-bismuth oxide as a binder glass.

8. The process according to claim 7, wherein the resistor paste contains ruthenium oxide as a conductor component and a lead borosilicate as a binder glass.

9. The process according to claim 8, wherein the gold plating layer has a thickness of 0.1 to 4 microns.

* * * * *